United States Patent [19]

Vora

[11] 4,322,882
[45] Apr. 6, 1982

[54] METHOD FOR MAKING AN INTEGRATED INJECTION LOGIC STRUCTURE INCLUDING A SELF-ALIGNED BASE CONTACT

[75] Inventor: Madhukar D. Vora, Los Gatos, Calif.

[73] Assignee: Fairchild Camera & Instrument Corp., Mountain View, Calif.

[21] Appl. No.: 118,178

[22] Filed: Feb. 4, 1980

[51] Int. Cl.³ .............................................. H01L 21/22
[52] U.S. Cl. ..................................... 29/571; 148/187; 148/188; 357/59; 357/92
[58] Field of Search .................. 148/188, 187; 29/571; 357/59, 92

[56] References Cited

U.S. PATENT DOCUMENTS

| | | | |
|---|---|---|---|
| 3,962,717 | 6/1976 | O'Brien | 148/187 X |
| 3,972,754 | 8/1976 | Riseman | 148/187 X |
| 3,993,513 | 11/1976 | O'Brien | 148/187 |
| 4,157,269 | 6/1979 | Ning et al. | 148/188 x |
| 4,190,466 | 2/1980 | Bhattacharyga et al. | 148/188 X |

Primary Examiner—G. Ozaki
Attorney, Agent, or Firm—Paul J. Winters; Michael J. Pollock; Theodore S. Park

[57] ABSTRACT

An integrated injection logic device is formed in a pocket of semiconductor material surrounded by oxide isolation, and separated from a substrate by an intervening region of opposite conductivity. The steps for forming the integrated injection logic device include depositing a first material which includes a first conductivity type impurity over a first portion of the epitaxial layer, treating the first material to cause at least some of the first conductivity type impurity to enter the epitaxial layer, and introducing an opposite conductivity type impurity into a second portion of the epitaxial layer. Typically, the first material is polycrystalline silicon doped with p conductivity type impurity.

16 Claims, 12 Drawing Figures

METHOD FOR MAKING AN INTEGRATED INJECTION LOGIC STRUCTURE INCLUDING A SELF-ALIGNED BASE CONTACT

BACKGROUND OF THE INVENTION

1. Field of the Invention

This invention relates to integrated circuits, and in particular to a method for manufacturing integrated injection logic devices having self-aligned base contacts, and the resulting structure.

2. Prior Art

Integrated injection logic devices and circuits are known in the art and have been the subject of numerous patents and publications. See, e.g., U.S. Pat. No. 3,962,717 to O'Brien. This patent discloses an integrated injection logic (I$^2$L) device formed in an oxide isolated region of an epitaxial layer of semiconductor material. Also known is the use of boron doped polycrystalline silicon as a diffusion source for p-type regions of I$^2$L devices. See, e.g., "Polycrystalline Silicon as a Diffusion Source and Interconnect Layer in I$^2$L Realizations" by Middelhoek and Kooy, *IEEE Journal of Solid State Circuits*, Vol. SC-12, No. 2, April 1977.

Prior art I$^2$L circuits, however, suffer from certain disadvantages relating to speed, density, number of fan-outs permitted, and the crossing of such structures by metal interconnecting lines. One goal in designing injection logic structures is to maintain the resistance of the base region while increasing the beta of the transistor. In prior structures, this has been accomplished by scaling of the structure in a horizontal or vertical direction. At a certain point, however, scaling does not provide further improvements in beta because the p+ collar which surrounds the n+ collectors determines the base resistance and beta.

SUMMARY OF THE INVENTION

An integrated injection logic structure is disclosed which offers improvements in speed, density, number of interconnects, number of fan-outs, and layout design over prior art structures. The method of manufacturing the integrated injection logic device in a pocket of first conductivity type epitaxial layer separated from a substrate of opposite conductivity type by an intervening region of first conductivity type comprises the steps of: introducing an opposite conductivity type impurity into a first portion of the epitaxial layer; depositing first material which includes opposite conductivity type impurity over a second portion of the epitaxial layer, the second portion including at least part of the first portion; treating the first material to cause at least some of the opposite conductivity type impurity to enter the epitaxial layer; and introducing first conductivity type impurity into a third portion of the epitaxial layer, the third portion including at least part of the first portion and none of the second portion. The injection logic cell formed using such a process will have a polycrystalline silicon base contact which is self-aligned to the base region. Further, the base resistance will be nearly independent of the extrinsic base area. Additionally, such a structure may be readily divided to allow interconnecting lines to cross the region of the silicon substrate in which the injection logic device is formed.

DETAILED DESCRIPTION

Figure 1:
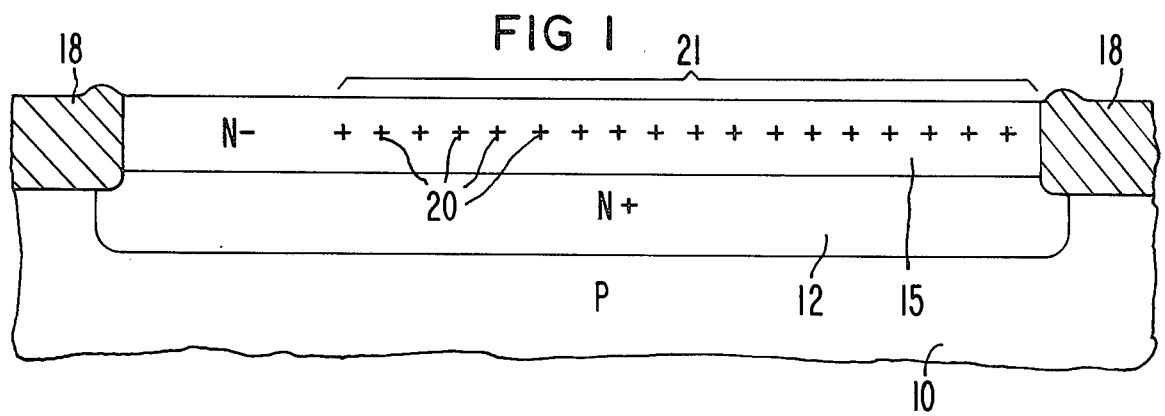
FIG. 1 is a cross sectional view of an early step in the fabrication of I$^2$L devices, showing the semiconductor substrate, the buried layer, the epitaxial layer, and the oxide isolation.

FIGS. 1 through 6 depict one method for fabricating the integrated injection logic structure of this invention. As shown in FIG. 1, using well-known integrated circuit technology, a buried layer 12 of n conductivity type material has been formed between a substrate of p type material and an epitaxial layer 15 of n-type material. Epitaxial layer 15 is electrically isolated from other portions of the integrated circuit structure (not shown) by a ring of oxide isolation 18, typically silicon dioxide, which surrounds epitaxial layer 15. Using well-known ion implantation techniques, p type impurity 20 has been introduced into region 21 of the epitaxial layer 15. Substrate 10 will usually be monocrystalline silicon having a resistivity of 2 to 5 ohm-centimeters. Buried layer 12, which will form the collectors of the integrated injection logic transistors will have an impurity concentration of $2 \times 10^{19}$ atoms per cubic centimeter, while a dose of p type material of approximately $10^{12}$ atoms per square centimeter at 190 kev is introduced into epitaxial layer 15 to convert portions of it to p conductivity type.

Figure 2:
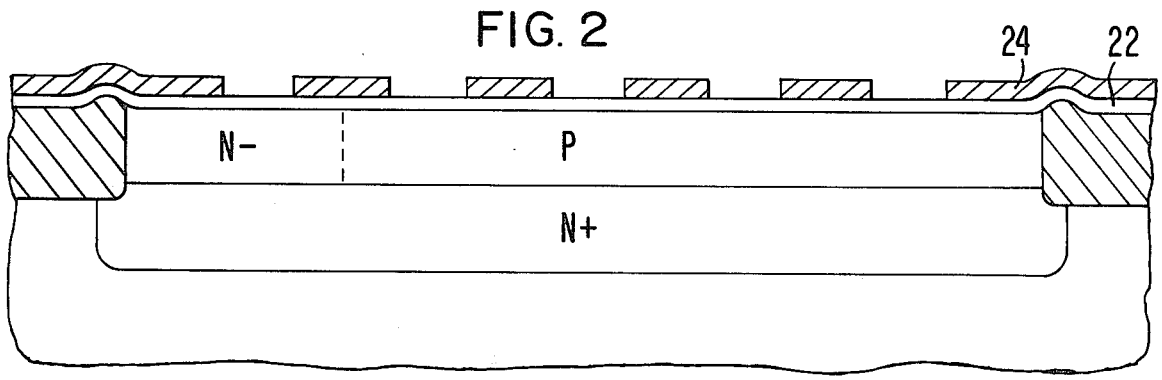
FIG. 2 shows the appearance of such a structure after layers of polycrystalline silicon 22 and, oxide 24 are formed over selected portions of the epitaxial layer.

Next, as shown in FIG. 2 a layer of polycrystalline silicon 22 is deposited across the upper surface of the integrated circuit structure. Polycrystalline silicon 22 may be deposited using any well-known technique, for example, by chemical vapor deposition. In one embodiment polysilicon 22 is 5000 Angstroms thick.

Polycrystalline silicon 22 will also include the desired concentration of p type impurity for use as a diffusion source during later processing. In one embodiment of the invention, $10^{15}$ atoms per square centimeter of boron is added to the polycrystalline silicon. Next, as also shown in FIG. 2, a layer of silicon dioxide 24 approximately 5000 Angstroms thick is deposited on the surface of polycrystalline silicon 22, for example, by chemical vapor deposition. Next, silicon dioxide 24 is suitably patterned using well-known photolithographic techniques.

Figure 3:
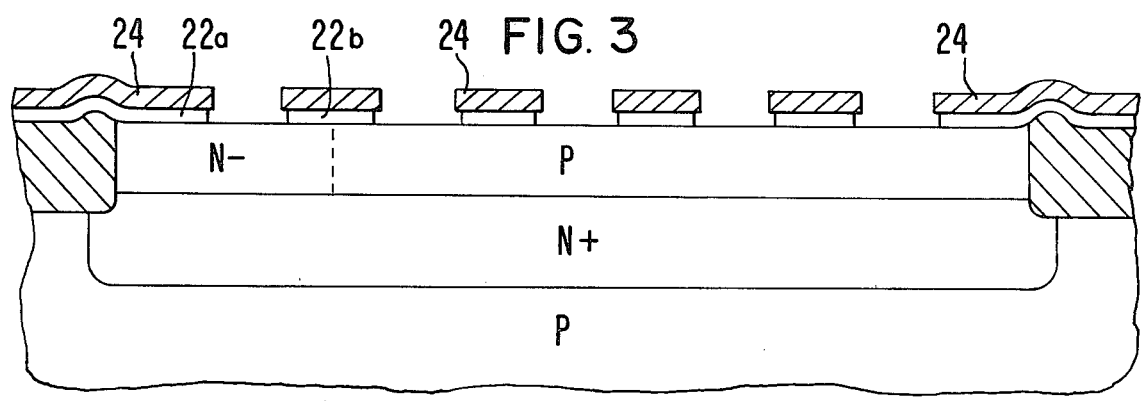
FIG. 3 shows the cross section after removal of some of the polycrystalline silicon.

The openings in oxide layer 24 are then used as a mask for removal of regions of polycrystalline silicon layer 22. The polycrystalline silicon 22 may be removed using any well-known chemical etching process, for example, by etching with a mixture of hydrofluoric and nitric acids. The appearance of the structure after removal of the thereby exposed portions of polycrystalline silicon layer 22 is shown in FIG. 3. The chemical etching results in undercutting, that is, the width of the silicon dioxide layer 24 will be slightly greater than the width of the underlying polycrystalline silicon 22. (See FIG. 3) As will be discussed, the undercutting, typically considered undesirable, is used to advantage in one embodiment of the invention.

Figure 4:
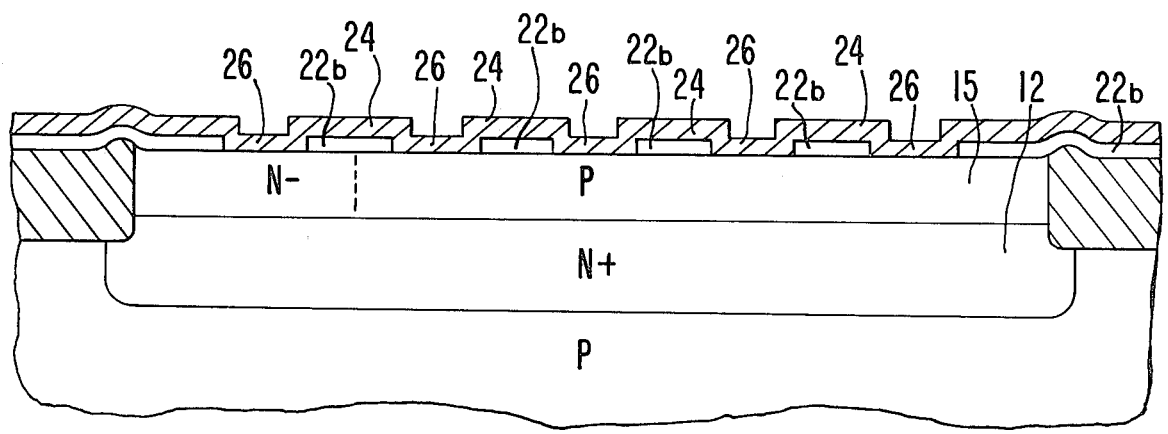
FIG. 4 shows the structure after additional oxide 26 is formed.

Next, as shown in FIG. 4 the integrated circuit structure is thermally oxidized by heating to 1000° C., to create regions of silicon dioxide 26 between the polysilicon regions 22. Oxide 26 is typically 1000 Angstroms thick and the thermal process will also slightly thicken oxide 24.

Figure 5:
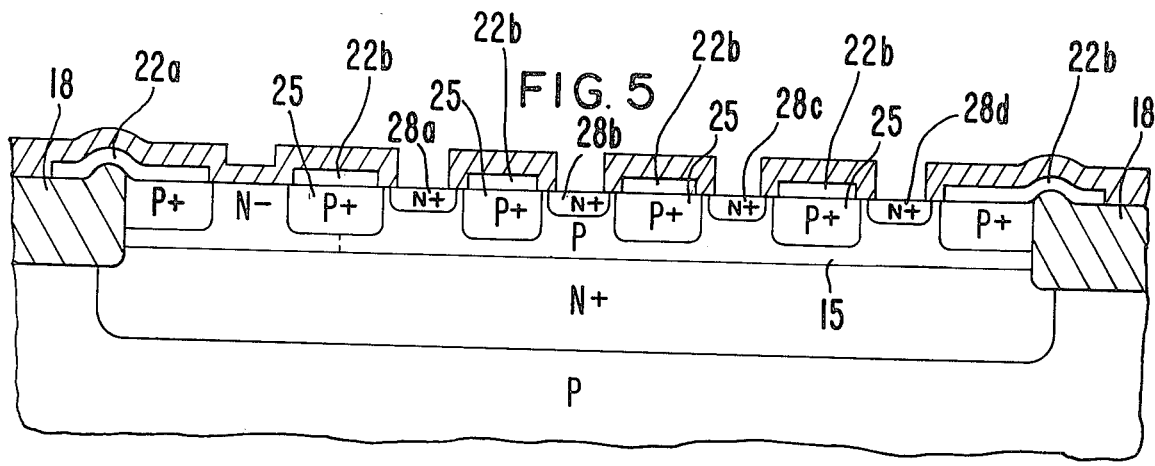
FIG. 5 shows the structure after removal of some oxide 26 and the introduction of n type impurity.

Then, as shown in FIG. 5, some of the silicon dioxide regions 26 are etched, typically using any well-known plasma etch process to prevent undercutting. A plasma comprising chlorine is typically used. The oxide 26 overlying the portion of epitaxial layer 15 which was not doped from n to p is not etched. As will be shown this portion of the epitaxial layer 15 functions as the base of the pnp transistor. The appearance of the remaining oxide 26 is shown in FIG. 5. Note that regions of oxide 26 remain on the ends of each region of polycrystalline silicon 22. Openings through this oxide 26 remaining on the ends of polysilicon 22 may be made later in the process to allow ohmic connections to be made to polysilicon 22. N type impurities 28 are then implanted through the openings in the oxide 24 and 26. In one embodiment arsenic or phosphorus is used to provide the n type impurities and a concentration of $10^{21}$ atoms per cubic centimeter is created in the epitaxial layer 15. The wafer is then heated to 1000° C. to drive in the n type impurities, and at this time the boron in polycrystalline silicon regions 22 will also diffuse into the single crystal silicon beneath regions 22 as shown in FIG. 5.

An alternative processing technique is to create silicon dioxide layer 24 by thermally oxidizing the polysilicon, rather than using chemical vapor deposition. If this technique is selected, the oxide 24 grown on polycrystalline silicon 22 cannot be as thick as if formed using chemical vapor deposition because the elevated temperatures may diffuse the boron from the polysilicon 22 into the single crystal silicon 15 too quickly and thereby convert the pnp base region from n type to p type. Hence, a relatively thin (3000 Angstroms) layer of oxide 24 is grown at a low temperature, for example, 900° C. After this layer is patterned and the underlying polysilicon 22 removed as shown in FIG. 3, oxide 26 is grown to approximately 1000 Angstroms thickness, and this layer is then plasma etched also with a plasma containing chlorine, with the remaining process following the description associated with FIG. 5.

Figure 6:
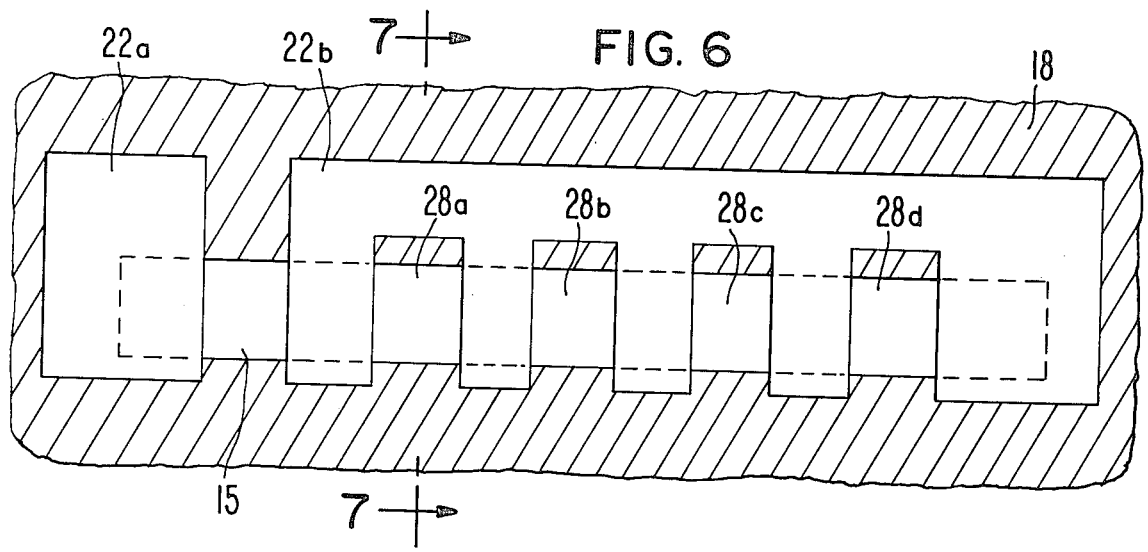
FIG. 6 is a top view of the structure of FIG. 5.

FIG. 6 is a top view of the structure shown in FIG. 5. Note that the polycrystalline silicon region 22 is divided into two portions, region 22a which serves as a contact to the emitter of a pnp transistor 45 (see FIG. 8), and region 22b which serves as a contact for the base regions of the npn transistors 50-53 (see FIG. 8). Note that polycrystalline silicon 22b overlies p type regions 25, with n type regions 28a-28d being formed in the gaps between the p type regions 25.

Figure 7:
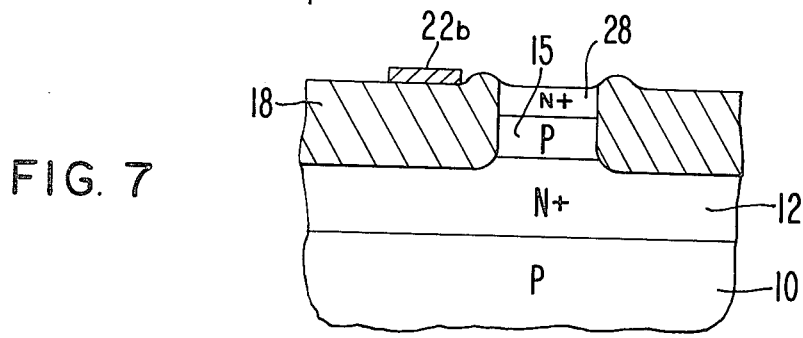
FIG. 7 shows a cross section taken through the structure shown in FIG. 6.

FIG. 7 is a cross sectional view taken through FIG. 6 as shown. FIG. 7 shows the polycrystalline silicon interconnection 22b displaced away from n type regions 28 which are formed between p type regions 25.

Figure 8:
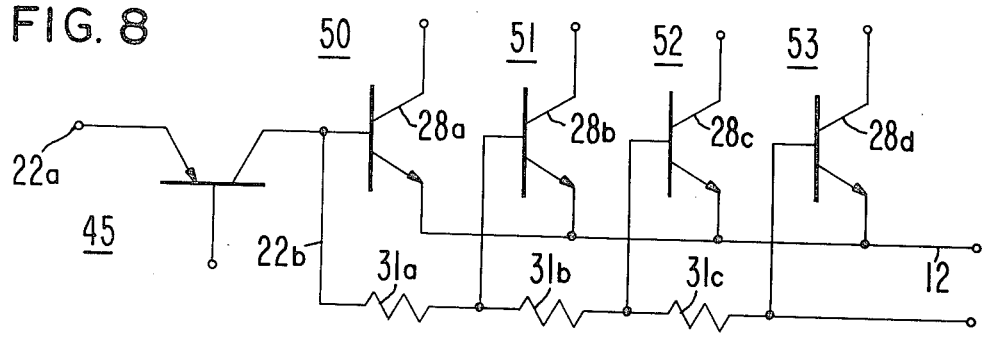
FIG. 8 is a schematic diagram of the I$^2$L circuit formed according to the process of FIGS. 1-7.

FIG. 8 is a schematic diagram showing the circuit created by the structure depicted in FIGS. 5, 6, and 7. Note that the components of FIG. 8 are given numerical designations corresponding to the appropriate regions shown in FIGS. 5, 6 and 7.

Figure 9:
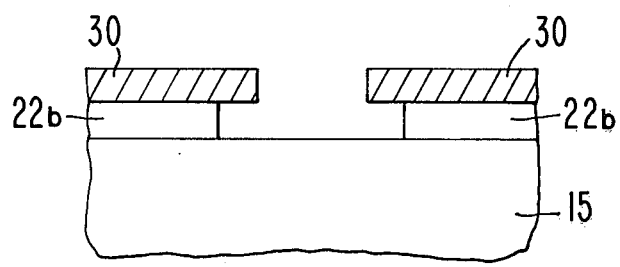
FIGS. 9-11 depict an alternate technique for making an I$^2$L device using thermally grown oxide layers and plasma etching.
Figure 10:
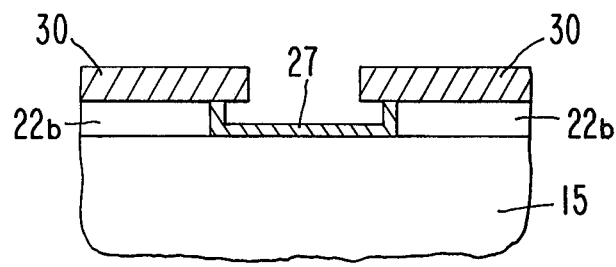
Figure 11:
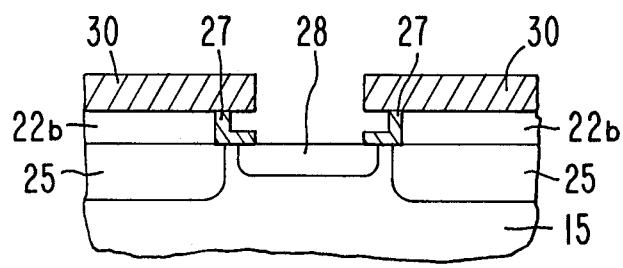

An alternative technique for fabricating an I²L structure using this invention is shown in FIGS. 9 through 11. The structure shown in FIG. 9 is obtained by following the same process steps depicted in FIGS. 1, 2 and 3, except that instead of forming oxide layer 24 by chemical vapor deposition it is created by thermal oxidation. Because it is formed using thermal oxidation, oxide layer 30 in FIG. 9 is given a different designation than oxide layer 24 in FIG. 2, although it should be understood both layers are comprised of silicon dioxide and perform the same function. Because the necessary prolonged elevated temperature required to generate oxide as thick as layer 24 would diffuse boron out of polycrystalline silicon layer 22 and into the underlying single crystal silicon too quickly, thereby lowering the base to buried layer breakdown voltage, a thinner layer of oxide 30 is grown at a lower temperature. Typically, oxide 30 will be approximately 3000 Angstroms thick and will be created by thermal oxidation at 900° C.

After the silicon dioxide layer 30 and polycrystalline layer 22 are etched as described in conjunction with FIG. 3, a thinner layer of silicon dioxide 27 is grown at approximately the same temperature as layer 30. Layer 27 will typically be approximately 1000 Angstroms thick. The appearance of the structure at this step in the process is depicted in FIG. 10.

Next, as shown in FIG. 11, a plasma etching process is used to create an opening in layer 27 through which n type impurities may be introduced to form region 28. When the wafer is heated to drive in the impurities to form region 28, boron, or other p type dopant will diffuse out of polycrystalline silicon 22 to form underlying p type regions 25, also as shown in FIG. 11. The resulting structure will have the same surface appearance as that depicted in FIG. 6.

Figure 12:
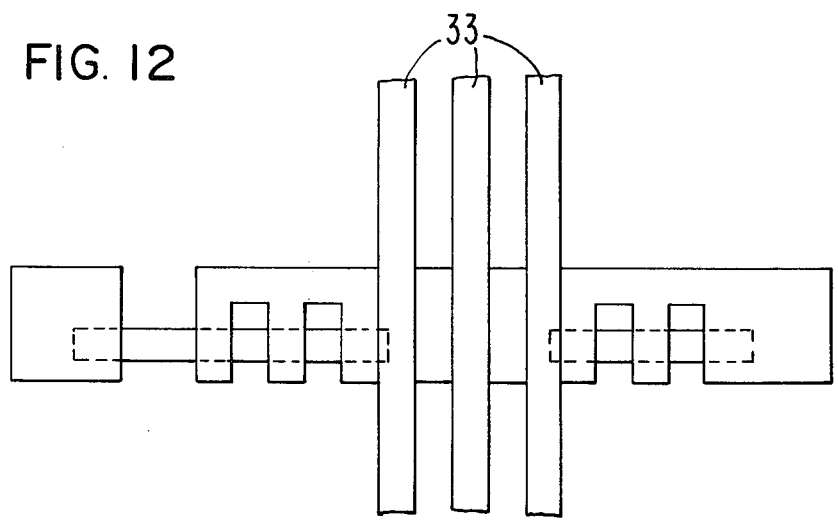
FIG. 12 shows an extended I$^2$L structure made possible as a result of this invention.

One further advantage of the I²L structure of this invention is shown in FIG. 12. Because the polycrystalline silicon region 22b is self-aligned over the base regions of the n-p-n transistors, the base resistance between the n-p-n bases will be extremely low, on the order of 100 ohms. These resistances are designated 31a, 31b, and 31c in FIG. 8. The low resistance allows the structure to be divided and extended as shown in FIG. 12 to allow one or more conducting lines 33 to traverse the structure. With prior art I²L structures, such an extension created unacceptably high base resistances, and therefore necessitated complicated and long interconnecting lines having many turns to avoid crossing the I²L structure.

What is claimed is:

1. A method for making an integrated injection logic device in a pocket of first conductivity type epitaxial layer separated from a substrate of opposite conductivity type by an intervening region of first conductivity type, the pocket surrounded by insulating material extending to contact said intervening region, the method comprising:
   introducing an opposite conductivity type impurity into a first portion of the epitaxial layer;
   depositing first material which includes opposite conductivity type impurity over a second portion of the epitaxial layer, the second portion including at least part of the first portion;

treating the first material to cause at least some of the opposite conductivity type impurity to enter the epitaxial layer; and introducing first conductivity type impurity into a third portion of the epitaxial layer, the third portion including at least part of the first portion and none of the second portion.

2. A method as in claim 1 wherein the first material is deposited over a plurality of spaced apart regions of the epitaxial layer and is deposited over a region of the insulating material to connect each one of the plurality of spaced apart regions to each of the remaining spaced apart regions.

3. A method as in claim 2 wherein the second portion of the epitaxial layer includes at least some of the regions of the epitaxial layer disposed between the spaced apart regions.

4. A method as in claim 1 wherein the first conductivity type impurity is N conductivity type impurity.

5. A method as in claim 1 wherein the first material is polycrystalline silicon.

6. A method as in claim 5 wherein the step of treating the first material is accomplished by heating the first material.

7. A method as in claim 1 wherein the step of depositing comprises;

forming a layer of first material over all of the epitaxial layer and the insulating material;

forming a layer of second material over all of the first material;

removing the second material from over regions where first material is not desired; and removing the thereby exposed regions of first material.

8. A method as in claim 7 wherein the step of introducing first conductivity type impurity comprises:

forming regions of second material to cover all of the epitaxial layer;

removing portions of the second material overlying the third portion of the epitaxial layer; and inserting the first conductivity type impurity into the third portion.

9. A method of making an integrated injection logic device in an electrically isolated pocket of first conductivity type material underlaid by a buried region of first conductivity type, the method comprising:

introducing opposite conductivity type impurity into a first portion of the pocket;

depositing a layer of first material which includes opposite conductivity type impurity over all of the pocket;

forming a layer of silicon oxide over the layer of first material;

patterning the oxide layer and the layer of first material such that first material remains over a second portion of the pocket which second portion includes at least part of the first portion and such that a third portion of the pocket is exposed which third portion includes at least part of the first portion and none of the second portion;

forming silicon oxide over all of the remaining first material except where the first material is in contact with the pocket;

patterning the silicon dioxide to expose parts of the third portion which are within the first portion;

introducing first conductivity type impurity into the exposed parts of the third portion; and treating the remaining first material to cause at least some of the opposite type impurity to enter the second portion of the pocket.

10. A method as in claim 9 wherein patterning of the silicon dioxide to expose parts of the third portion which are within the first portion is by plasma etching.

11. A method as in claim 10 wherein the second portion is entirely within the first portion.

12. A method as in claim 11 wherein the first conductivity type is N.

13. A method as in claim 12 wherein the first material is p-doped polycrystalline silicon.

14. In a method for making a semiconductor device in a pocket of first conductivity type epitaxial layer separated from a substrate of opposite conductivity type by an intervening region of first conductivity type, the pocket surrounded by insulating material extending to contact said intervening region, the steps comprising:

introducing an opposite conductivity type impurity into a first portion of the epitaxial layer;

depositing first material which includes opposite conductivity type impurity over a second portion of the epitaxial layer, the second portion including at least part of the first portion;

treating the first material to cause at least some of the opposite conductivity type impurity to enter the epitaxial layer; and introducing first conductivity type impurity into a third portion of the epitaxial layer, the third portion including at least part of the first portion and none of the second portion.

15. A method as in claim 14 wherein the step of depositing comprises:

forming a layer of first material over all of the first material;

forming a layer of second material over all of the first material;

removing the second material from over regions where first material is not desired; and removing the thereby exposed regions of first material.

16. A method as in claim 15 wherein the step of introducing first conductivity type impurity comprises:

forming regions of second material to cover all of the epitaxial layer;

removing portions of the second material overlying the third portion of the epitaxial layer; and inserting the first conductivity type impurity into the third portion.

* * * * *